(12) United States Patent
Van Buskirk et al.

(10) Patent No.: US 6,184,550 B1
(45) Date of Patent: Feb. 6, 2001

(54) TERNARY NITRIDE-CARBIDE BARRIER LAYERS

(75) Inventors: Peter C. Van Buskirk, Newtown; Michael W. Russell, New Milford, both of CT (US)

(73) Assignee: Advanced Technology Materials, Inc., Danbury, CT (US)

( * ) Notice: Under 35 U.S.C. 154(b), the term of this patent shall be extended for 0 days.

(21) Appl. No.: 09/141,971

(22) Filed: Aug. 28, 1998

(51) Int. Cl.$^7$ .................................. H01L 29/72
(52) U.S. Cl. .............. 257/306; 257/310; 257/639; 257/640; 257/649; 257/751; 257/761; 257/765; 257/768; 257/771; 438/627; 438/653; 438/685
(58) Field of Search .................. 257/310, 306, 257/639, 640, 649, 751, 761, 765, 768, 771; 438/627, 648, 653, 656, 685, 688, 694, 757

(56) References Cited

U.S. PATENT DOCUMENTS

| | | | |
|---|---|---|---|
| 5,504,041 | 4/1996 | Summerfelt et al. | 437/235 |
| 5,585,300 | 12/1996 | Summerfelt | 437/60 |
| 5,665,628 | 9/1997 | Summerfelt | 438/3 |
| 5,679,980 | 10/1997 | Summerfelt | 257/751 |
| 5,696,018 | 12/1997 | Summerfelt | 437/60 |
| 5,770,520 | 6/1998 | Zhao et al. | 438/653 |
| 5,965,942 * | 12/1999 | Itoh et al. | 257/298 |

FOREIGN PATENT DOCUMENTS 0 821 415 A2  1/1998  (EP) .................. H01L/27/115

OTHER PUBLICATIONS

U.S. application No. 08/975,366, Van Buskirk et al. filed Nov. 20, 1997.
U.S. application No. 08/974,779, Kirlin filed Nov. 20, 1997.
Kolowa, E. et al, "Amorphous metallic alloys: a new advance in thin film diffusion barriers for Cu metallization", *Submicron Metallization, SPIE Proceedings* # 1805, 11–17 (1992) Jan.
Kudo, J. et al, "A high stability electrode technology for stacked $SrBi_2Ta_2O_9$ capacitors applicable to advance ferroelectric memory" *IEDM Technical Digest*, 609–612 (1997), Jan.
Toth, L.E., *Transition metal carbides and nitrides*, Academic Press, New York, 1971, p. 5, Jan.
Toth, L.E., *Transition metal carbides and nitrides*, Academic Press, New York, 1971, p. 188, Jan.

* cited by examiner

*Primary Examiner*—Edward Wojciechowicz
(74) *Attorney, Agent, or Firm*—Steven J. Hultquist; Oliver A. M. Zitzmann

(57) ABSTRACT

A microelectronic structure including adjacent material layers susceptible of adverse interaction in contact with one another, and a barrier layer interposed between said adjacent material layers, wherein said barrier layer comprises a binary, ternary or higher order metal nitride-carbide material, whose metal constituents are different from one another and include at least one metal selected from the group consisting of transition metals Ti, V, Cr, Zr, Nb, Mo, Hf, Ta, W, Sc and Y, and optionally further including Al and/or Si. The barrier layer is stoichiometrically constituted to be amorphous or nanocrystalline in character, and may be readily formed by techniques such as chemical vapor deposition, sputtering, and plasma-assisted deposition, to provide a diffusional barrier of appropriate resistivity character for structures such as DRAMs or non-volatile ferroelectric memory cells.

54 Claims, 1 Drawing Sheet

TERNARY NITRIDE-CARBIDE BARRIER LAYERS

BACKGROUND OF THE INVENTION

1. Field of the Invention

This invention relates to transition metal nitrides and carbides that are useful as conductive barrier layers in IC memory cell structures that utilize ferroelectric or high permittivity capacitors. In specific aspects, the invention relates to microelectronic device structures including such conductive barrier layers, and to a method of forming same.

2. Description of the Related Art

Barrier layers are crucial components in many integrated circuits. Depending on the specific application, such barrier layers may be used to prevent diffusion of oxidizing species, silicon, metals, hydrogen, etc., and to promote adhesion, typically while maintaining either adequate electrical conductance or resistance.

Two important applications include copper for advanced metallization using damascene processing, and ferroelectric and high permittivity perovskite oxide films for advanced memories.

Copper has recently come into usage as a practical alternative to aluminum for metallization, in which copper solutions are applied to a substrate under low voltage conditions to cause deposition of the copper metal, followed by chemical mechanical polishing for removal of copper from unwanted areas of the device structure. In such application, to prevent reactions between the copper and the silicon substrate, barrier layers are employed.

The perovskite oxides include $BaSrTiO_3$ (BST) for DRAMs and $PbZrTiO_3$ (PZT) and $SrBi_2Ta_2O_9$ (SBT) for FeRAMs. It is well known that these materials require electrodes made from noble metals or noble metal alloys such as Pt, Ir, $IrO_2$, Pt—Ru, etc. In many memory cell designs, it is desirable to fabricate the capacitors directly over a conductive plug (typically tungsten or polycrystalline silicon) to contact transistors, in order to reduce the area of the memory cell. This geometry (capacitor over plug) is conventionally referred to as a stack capacitor configuration.

For these materials in a stack capacitor configuration, an electrically conductive barrier layer is needed to prevent oxidation of the plug and to prevent diffusion of the plug material through the noble metal bottom electrode. It also may be desirable to use fabrication and structural isolation techniques to protect the plug/barrier/electrode interfaces from oxidation.

A variety of barrier layer materials and associated fabrication techniques have been described in the patent and general technical literature. TiN, TaSiN and TiAlN are typical thin film compositions that have been described as useful for the memory applications discussed above. The principal advantage of TiN is its familiarity in currently utilized manufacturing processes, although several studies have shown it to fail as an adequate barrier layer for perovskite materials under processing temperatures greater than 550° C.

TaSiN has been identified as a potentially useful barrier layer material of fabrication for copper damascene applications in both the use of ferroelectrics and in use of perovskite materials. In ferroelectric applications, when used in a hybrid electrode as a barrier between $IrO_2$ and polysilicon (p-Si), TaSiN (at a stoichiometric ratio of Ta/Si=10/3) remains conductive after capacitor processing in oxygen to a temperature of 800° C.

The advantage claimed for TaSiN and other metal-silicon nitride (Me—Si—N) compounds is that the presence of silicon tends to prevent crystalline ordering in the thin film. An amorphous TaSiN film has improved resistance to oxidation and diffusion of other species because of the absence of crystalline grain boundaries, since such grain boundaries often facilitate diffusion and subsequent chemical reactions.

Besides TaSiN, other metal silicon nitride thin films have been investigated, wherein the metal constituent is tungsten, titanium, or rhenium. While these amorphous barrier layers have excellent properties, other constraints may require that alternative amorphous barrier layers be utilized. These constraints include the desirability of good step coverage in high aspect ratio trenches and vias, and other combinations of metals may be more amenable to CVD processes to deposit binary or ternary metal nitride and carbide alloys. For deposition using reactive sputtering, it is also known that atoms with higher atomic weight allow improved sidewall coverage because the trajectory of incident atoms is modified by their mass, and alloys with higher atomic weight metals are therefore desirable.

The use of $Ti_{1-x}Al_xN$ in barrier layer structures is disclosed in Summerfelt et al. U.S. Pat. No. 5,504,041 for "Conductive Exotic-Nitride Barrier Layer for High-Dielectric-Constant Materials." When deposited via reactive sputtering using a titanium-aluminum target, a polycrystalline thin film is produced, with crystalline structure when x<0.60, i.e., with aluminum replacing titanium in the crystalline lattice. The conductivity of these thin films is adequate for satisfactory performance as a conductive barrier. For example, adequate conductance is maintained using $Ti_{0.60}Al_{0.40}N$ beneath 1000 Å thick platinum films when the layers are subjected to oxidizing conditions exceeding 650° C.

In general, the introduction of aluminum in place of titanium increases the resistance of the resulting titanium-aluminum nitride film to macroscopic oxidation. It is believed that the mechanism for this improvement of oxidation resistance of the TiAlN barrier layer under platinum films (while maintaining sufficiently low contact resistance) involves localized oxidation of the barrier at platinum grain boundaries, with relatively undisturbed contact between the barrier layer and the bulk mass of the platinum grains.

While $Ti_{1-x}Al_xN$ films have superior properties compared to those of many other candidate barrier layers, the properties of such $Ti_{1-x}Al_xN$ films would be improved if they could be deposited in an amorphous state, and remain in an amorphous state when subjected to temperatures greater than those employed in subsequent processing (e.g., ferroelectric processing temperatures on the order of 800° C. for formation of strontium bismuth tantalate (SBT) ferroelectric thin films). Such improvement will likely be required to achieve highly robust contacts when high temperature processing is used, especially for fabrication of devices with very small feature sizes, i.e. <0.35 μm.

SUMMARY OF THE INVENTION

In one aspect, the present invention relates to a microelectronic structure including adjacent material layers susceptible of adverse interaction in contact with one another, and a barrier layer interposed between said adjacent material layers, wherein said barrier layer comprises a binary, ternary or higher order metal nitride-carbide material, whose metal constituents are different from one another and include at least one metal selected from the group consisting of transition metals Ti, V, Cr, Zr, Nb, Mo, Hf, Ta, W, Sc and Y.

Another aspect of the invention relates to a method of making a microelectronic structure including adjacent material layers susceptible of adverse interaction in contact with one another, including a first underlying layer and a second overlying layer, comprising forming a barrier layer on the first underlying layer, and forming said second overlying layer on the barrier layer, wherein said barrier layer comprises a binary, ternary or higher order metal nitride-carbide material, whose metal constituents are different from one another and include at least one metal selected from the group consisting of transition metals Ti, V, Cr, Zr, Nb, Mo, Hf, Ta, W, Sc and Y.

In such method aspect, the barrier layer may be formed by a process such as:

reactive sputtering using a reactive source of nitrogen and carbon;

chemical vapor deposition;

nitridation of a deposited metallic layer;

carbidation of a deposited metallic layer; or ion implantation of a deposited metallic layer.

In a preferred aspect, the barrier layer may be formed from a sputtering target with a corresponding metal composition, wherein the relative fractions of N and C in the barrier layer are controlled by sputtering conditions.

As used herein, the term "binary, ternary or higher order metal nitride-carbide material" refers to a material containing at least two different metals selected from the metal species described hereinabove, as well as nitrogen and carbon.

The form of such metal nitride-carbide material may be a single compound, wherein the various metals are coordinated to carbon and nitrogen atoms. Alternatively, the material may comprise a mixture or blend of individual compounds, such as for example a metal carbide of a first metal species, in alloy, mixture or other combined form with a metal nitride of a second metal species. Such metal nitride-carbide material may be substantially oxygen-free in composition.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
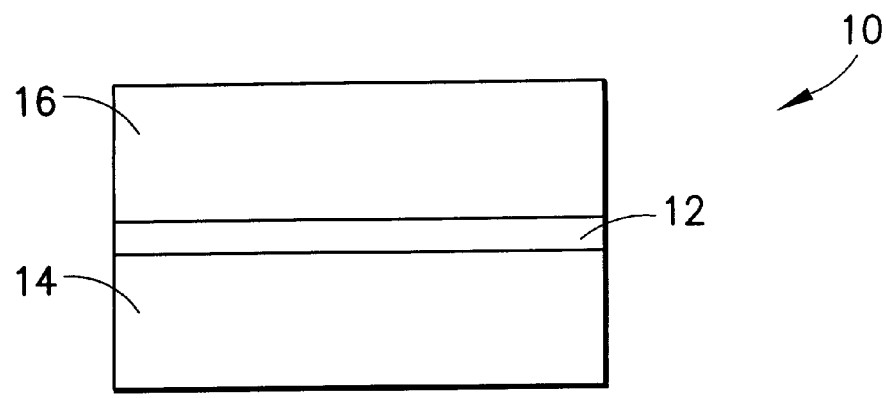
FIG. 1 is a schematic representation of a microelectronic structure comprising a barrier layer, in accordance with an embodiment of the present invention.

The disclosures of the following United States Patent Applications and United States Patent are hereby incorporated herein by reference in their entireties: U.S. patent application Ser. No. 08/975,366 filed Nov. 20, 1997 in the names of Peter C. Van Buskirk, et al. for "Chemical Mechanical Polishing of FeRAM Capacitors;" U.S. patent application Ser. No. 08/974,779 filed Nov. 20, 1997 in the name of Peter S. Kirlin for "Method of Fabricating a Ferroelectric Capacitor With a Graded Barrier Layer;" U.S. Pat. No. 5,770,520 issued Jun. 23, 1998 in the names of Joe W. Zhao, et al. for "Method of Making a Barrier Layer for Via or Contact Opening of Integrated Circuit Structure;" European Patent Application No. 97305657.5 filed Jul. 28, 1997 in the names of Y. Fukada, et al. for "A capacitor and method of manufacture thereof;" U.S. Pat. Nos. 5,665,628 and 5,696,018 issued Sep. 9, 1997 and Dec. 9, 1997 in the name of Scott R. Summerfelt for "Method of Forming Conductive Amorphous-Nitride Barrier Layer for High-Dielectric Constant Material Electrodes" and "Method of Forming Conductive Noble Metal-Insulator-Alloy Barrier Layer for High Dielectric Constant Material Electrodes," respectively.

The present invention relates to the use of binary, ternary and higher order transition metal nitrides and carbides for use as conductive barrier layers in integrated circuit memory cell structures including ferroelectric or high permittivity capacitors. Capacitors of those types are used for non-volatile memories or for dynamic random access memories (DRAMs), respectively.

In such capacitor device structures, the barrier layer acts to prevent interdiffusion between the plug and the bottom electrode (BE) layer.

The plug is typically formed of tungsten (W) or polysilicon (p-Si), and the bottom electrode layer is typically formed of noble metals, such as Ir, Pt, Pd, Rh, Os, etc., or conductive oxides of those metals, such as $RhO_x$, $IrO_x$ or $OsO_x$, or mixtures of noble metals and their conductive oxides, and may optionally include dopant species.

Barrier layers formed in accordance with the present invention may be usefully employed in high-density metallization schemes that use damascene patterning of copper, in order to prevent diffusion of copper into Si or $SiO_2$ regions of the device structure.

A key aspect of the invention relates to barrier layers formed with compounds having extremely high melting points, and a very strong tendency to remain amorphous subsequent to deposition, due to the very low mobility of the material at processing temperatures. Thin films that contain a sufficient fraction of such high melting point compounds will also be amorphous because the extremely low mobility of those species will inhibit mobility of other species. TaC, for example, has the highest melting point known, (see Table 1, below), and its resistivity makes it a desirable choice for incorporation in barrier layers of these types. TaC is most preferably used in barrier layers that contain Ta or TaN.

Table 1 below sets out melting point, bulk resistivity at room temperature, and thin film resistivity, of some illustrative transition metal nitrides and carbides. Ranges for ρ are attributed to stoichiometric differences of the material.

TABLE 1

| | Melting Point (° C.) | Bulk ρ ($\mu\Omega$) Room Temp. | Thin Film ρ ($\mu\Omega$-cm) |
|---|---|---|---|
| TaC | 3983 | 25–42 | — |
| HfC | 3928 | 37–45 | — |
| ZrC | 3420 | 42–50 | — |
| HfN | 3387 | 33 | ~200–700 |
| TaN | 3093 | 128 | <250 (AMAT adv.) |
| TiC | 3067 | 68–188 | — |
| ZrN | 2982 | 37 | — |
| TiN | 2949 | 25–54 | ≈45 sputtering >100 (CVD) |
| WC | 2776 | 22 | — |

In the broad practice of the present invention, the barrier layer resistivity may readily be optimized for a specific deposition system, by the simple expedient of varying the process conditions (temperature, pressure, flow rate and stoichiometric compositions), and empirically determining the resulting resistivity.

The barrier layer films of the present invention possess a high activation energy characteristic that minimizes electromigration failure. Such barrier layer films may use higher atomic weight elements where appropriate to increase sidewall coverage in sputtering processes to form the barrier.

The resistivity of the barrier layer in the broad practice of the invention may be selectively varied by use or addition of specific metal carbides such as TaC or HfC.

In a broad aspect, the invention relates to a microelectronic structure including adjacent material layers susceptible of adverse interaction in contact with one another, and a barrier layer interposed between said adjacent material layers, wherein said barrier layer comprises a binary, ternary or higher order metal nitride-carbide material, whose metal constituents are different from one another and include at least one metal selected from the group consisting of transition metals Ti, V, Cr, Zr, Nb, Mo, Hf, Ta, W, Sc and Y.

In such microelectronic structure, the metal nitride-carbide material may further include silicon and/or aluminum.

The microelectronic structure may be a memory cell integrated circuit structure, e.g., comprising a capacitor overlying a plug layer, with the capacitor including top electrode, capacitive material layer and bottom electrode layers, wherein the plug layer and the bottom electrode layer of the capacitor constitute the adjacent material layers susceptible of adverse interaction in contact with one another.

In a specific embodiment, the memory cell integrated circuit structure may be a non-volatile memory cell integrated circuit structure, and the capacitive material layer may be formed of a ferroelectric material.

In another embodiment, the memory cell integrated circuit structure may include a dynamic random access memory cell integrated circuit structure, and the capacitive material layer may be formed of a high permittivity material.

Suitable high-dielectric-constant materials that may be usefully employed in capacitive layers of DRAM capacitors in the practice of the present invention include materials such as barium strontium titanate, lead zirconate titanate, lead lanthanum titanate, lead lanthanum zirconate titanate, bismuth titanate, potassium tantalate, lead scandium tantalate, lead niobate, lead zinc niobate, potassium niobate, lead magnesium niobate, or combinations thereof.

The invention thus contemplates a microelectronic structure that may include a capacitor structure such as a stack capacitor or a trench capacitor.

In another embodiment, the microelectronic structure of the invention may be constituted by a device structure including a metallization layer and a substrate or dielectric, which are protected from contact and deleterious interaction with one another by a barrier layer according to the invention. In such embodiment, the metallization layer may include copper metallization, and the substrate or dielectric may include Si or $SiO_2$, respectively.

In a specific embodiment, the microelectronic structure of the invention may comprise a trench capacitor structure including a capacitor electrode formed of a metal such as platinum or iridium, in which the barrier layer comprises a binary, ternary or higher order metal nitride-carbide material that includes a metal such as Hf, Ta and/or W.

In some applications it is critical to minimize barrier layer resistivity, such as in Cu barrier layers which will take up a significant fraction of the cross-section of the conductor in ULSI metallization schemes. TaN is known to be useful for this application. To minimize the loss in conductivity, the addition of TaC, to provide a metal nitride-carbide composition in accordance with the invention, will decrease resistivity and result in an amorphous or nanocrystalline microstructure, which will improve barrier properties and facilitate reduced barrier thickness. For example, the nitride-carbide barrier material may comprise a mixture of TaN and TaC in sufficient proportions relative to each other to produce such amorphous or nanocrystalline structure, preferably providing a material having a resistivity that is less than that of TaN (i.e., <240 $\mu\Omega\cdot cm$.).

In general, the source materials used to form the barrier layer should not contain oxygen, and the formation of the barrier layer should be carried out in the absence of oxygen, to avoid forming undesirable oxides that increase the resistivity of the barrier layer (cf. the contrary teachings of Summerfelt U.S. Pat. No. 5,696,018 concerning the desirability of O in TiN barrier layers; these Summerfelt teachings suggest away from the present invention). Accordingly, the barrier layer of the invention preferably is substantially free of oxygen, i.e., substantially oxide-free. Any O present is desirably less than 5 atomic %, preferably less than 3 atomic % and most preferably less than 1 atomic % of the barrier material.

The addition of HfC or TaC to metal nitrides (TiN) or mixed metal nitrides (e.g. TiAlN) will tend to reduce grain size and under appropriate conditions and proportions of carbide to nitride results in amorphous films, which will improve barrier properties and allow reduced barrier thickness. One example is $Ti_mTa_nAl_{1-m-n}N_xC_y$, which may be formed from a sputtering target with a corresponding metal composition, in a reactive process where the relative fractions of N and C are controlled by the sputtering conditions. Appropriate conditions for such process may be readily empirically determined by the skilled artisan, without undue experimentation.

As intentional constituents of the barrier layer material (cf. the impurity species C and O in the barrier layer material of Summerfelt U.S. Pat. No. 5,696,018), the sum of carbon and nitrogen in the barrier layer material in the practice of the present invention will typically be greater than 5 atomic % of the barrier layer material, and in some applications of the invention, the sum of carbon and nitrogen in the barrier layer material will be preferably at least 35 atomic %, and more preferably at least 50 atomic % or even higher, with the balance of the barrier material layer being comprised of the required cations.

Barrier layers according to the present invention may be made by reactive sputtering using $N_2$, $CH_4$ (or other reactive sources of N and C), CVD, or by nitridation, carbidation or ion implantation of preexisting metallic layers.

As an example of the fabrication of a ferroelectric capacitor structure in accordance with the invention, a semiconductor substrate may be provided that has a plug formed of suitable material, e.g., tungsten, in a via, providing contact with an underlying integrated circuit structure (e.g., to a gate contact of a MOS device) or to an underlying metal interconnect or wiring level.

A conductive barrier layer in accordance with the invention may be deposited over the plug to prevent diffusion of the plug material and deleterious interaction between the plug material and the overlying electrode of the memory cell capacitor, formed as described below. The barrier layer may for example be formed of $Ti_mTa_nAl_{1-m-n}N_xC_y$, by reactive sputtering from a corresponding TiTaAl target, using $N_2$, $CH_4$ as the respective nitrogen and carbon source materials.

A conductive layer of material is then deposited on the barrier layer, e.g., a metal such as platinum, iridium, rhodium, or other noble metal compositions. The metallic conductor may be suitably deposited by a chemical vapor deposition (CVD) process, using well-known apparatus and processing parameters.

After the layer of conductive material is deposited on the substrate, the conductive material is formed into a desired shape of a capacitor plate by conventional techniques well-known in the art, for the purpose of fabricating the storage capacitor of an integrated circuit memory device. A photoresist is suitably deposited over the layer of conductive material, and the photoresist is patterned. The layer of conductive material then is etched away, by a suitable conventional etch technique, except for the shape of the capacitor plate. This capacitor plate thus forms the first, or bottom, plate of the storage capacitor being fabricated.

Next, a layer of insulative material is deposited over the first capacitor plate and any exposed surfaces of the substrate. The insulative material is a high dielectric material with ferroelectric characteristics, such as lead zirconium titanate ($PbZrTiO_3$) or strontium bismuth tantalum oxide ($SrBi_2Ta_2O_9$). These ferroelectric materials can be deposited by a chemical vapor deposition process using known apparatus and processing parameters. After the insulative layer is deposited, it is shaped to conform to the desired capacitor dielectric shape.

The shaping of the ferroelectric material into a capacitor dielectric layer may be accomplished by depositing a photoresist material over the layer of ferroelectric material, patterning the photoresist, and etching away undesired ferroelectric material. Such etching may be readily accomplished by use of a conventional dry etch process.

Another layer of conductive material, e.g., a metal such as aluminum, tungsten, platinum, iridium, rhodium, etc., then is deposited over the capacitor dielectric. For ease of fabrication, the choice of metal for this layer may be the same material as the metal selected for use in the first capacitor plate (bottom electrode). The selected metal can be deposited by chemical vapor deposition (CVD) using known apparatus and processing parameters.

After the top electrode conductive layer is deposited, it is shaped into a second capacitor plate. Such shaping may be carried out by depositing a photoresist material over the conductive layer, patterning the photoresist, and etching away undesired portions of the conductive layer. The etch removal of undesired portions of the conductive layer may be effected with any suitable conventional etching process having utility for such purpose, to provide a second capacitor plate on top of the capacitor dielectric layer.

The barrier layer of the invention may be formed in any suitable manner and at any suitable process conditions yielding a material layer of the desired barrier characteristics, electrical properties, etc. Such formation may be carried out by sputtering, chemical vapor deposition, ion implantation of a previously formed metal layer, carbidation of a previously formed metal layer, nitridation of a previously formed metal layer, plasma-assisted deposition, solution deposition, physical vapor deposition, or any other suitable methodology. Deposition techniques that may be adapted to the formation of the barrier layer of the present invention include those described in U.S. Pat. No. 5,770, 520, the disclosure of which is hereby incorporated by reference in its entirety.

In general, the barrier layer will be formed at a suitable thickness having appropriate resisitivity characteristics, e.g., not exceeding about 5000 ohms/square and most preferably not exceeding about 1000 ohms/square. In most applications, the thickness of the barrier layer will be less than 5000 Angstroms, preferably less than 1000 Angstroms, and most preferably less than about 500 Angstroms, however, the specific thickness of the barrier layer may be widely varied, depending on the specific microelectronic structure, the compositional characteristics of the barrier layer material, and the barrier layer properties desired.

Referring now to the drawings, FIG. 1 is a schematic representation of a microelectronic structure 10 comprising a barrier layer 12, in accordance with an embodiment of the present invention. As illustrated, the barrier layer 12 is disposed between the underlying layer 14, which may for example comprise a substrate or dielectric material, and an overlying layer 16, which may for example comprise a metal layer that is susceptible to deleterious interaction with the underlying layer in contact therewith.

For example, the barrier layer 12 may be employed in high-density metallization structure that uses damascene patterning of copper in the layer 16, in order to prevent diffusion of copper into layer 14 comprising Si or $SiO_2$ regions of the device structure.

Alternatively, the structure 10 may be a relevant portion of a trench capacitor memory cell structure, or a stack capacitor memory cell structure, or some other microelectronic structure in which it is desired to isolate respective layers from diffusive interaction or other deleterious result.

The barrier layer of the invention may also be employed for barrier purposes in a device structure in which one of the adjacent layers is an organic insulating layer including fluorine therein, and wherein the barrier layer serves to contain such organic insulating layer, against fluorine migration. As another example, the barrier layer of the invention may be used in a structure in which one of the adjacent layers is an insulating material layer with copper in such layer.

Figure 2:
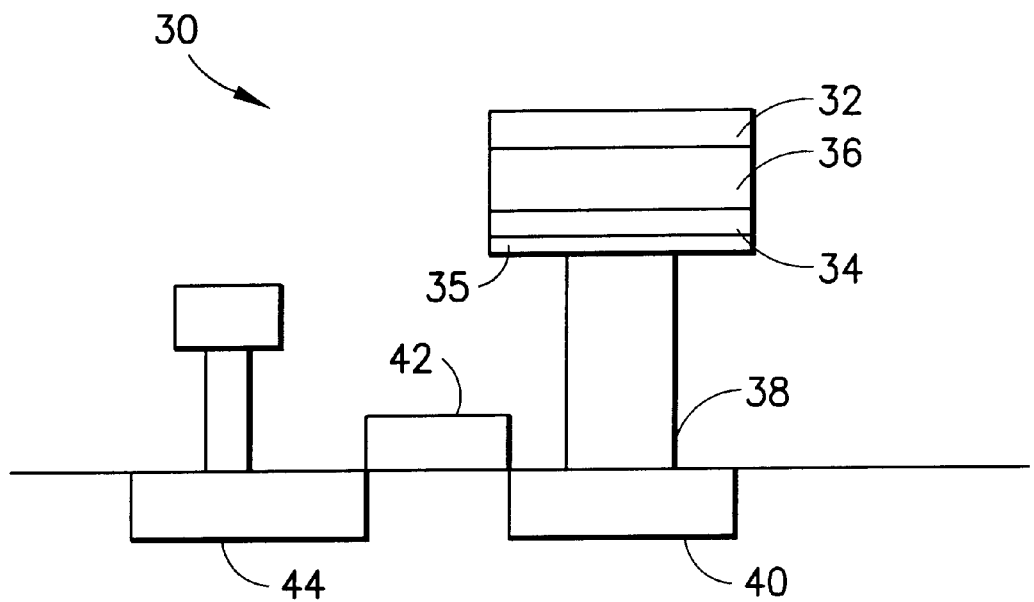
FIG. 2 is a schematic representation of an integrated circuit memory cell structure, utilizing a conductive barrier layer in accordance with one aspect of the invention, and comprising a stack capacitor which is plug-connected to the drain of a MOSFET structure, wherein the device utilizes an SBT ferroelectric capacitor layer.

FIG. 2 is a schematic representation of an integrated circuit memory cell structure utilizing a conductive barrier layer 35 in accordance with one aspect of the invention, comprising a stack capacitor 30 which is plug-connected to the drain of a MOSFET structure, wherein the device structure includes a ferroelectric capacitor layer 36, e.g., formed of SBT.

The capacitor 30 comprises a top electrode 32, and bottom electrode 34 on which is disposed the thin film ferroelectric material layer 36, as shown. The bottom electrode 34 is connected by plug 38 to the drain 40 of the transistor, with the bottom electrode layer being isolated from the plug by barrier layer 35. The plug may be made of any suitable material, as for example from polysilicon or tungsten. The transistor comprises gate 42 and a source 44.

As shown, the conductive barrier layer 35 is formed so that it resides between the plug 38 and the bottom electrode 34. The barrier layer 35 may for example comprise a titanium-aluminum-nitride-carbide, wherein the atomic ratio of titanium to aluminum is on the order of 1.5, and wherein the barrier layer material is in an amorphous state.

While the invention has been described herein with reference to illustrative features, aspects and embodiments, it will be appreciated that the utility of the invention is not thus limited, but rather extends to and encompasses numerous other variations, modifications and other embodiments, as will readily suggest themselves to those skilled in the art based on the disclosure herein. The claims hereinafter set forth are therefore intended to be broadly construed and interpreted, to comprehend all such other variations, modifications and other embodiments, as being within the spirit and scope of the invention.

What is claimed is:

1. A microelectronic structure including adjacent material layers susceptible of adverse interaction in contact with one another, and a barrier layer interposed between said adjacent material layers, wherein said barrier layer comprises a binary, ternary or higher order metal nitride-carbide material, whose metal constituents are different from one another and include at least one metal selected from the group consisting of transition metals Ti, V, Cr, Zr, Nb, Mo, Hf, Ta, W, Sc and Y.

2. A microelectronic structure according to claim 1, wherein said metal nitride-carbide material further comprises at least one element selected from the group consisting of silicon and aluminum.

3. A microelectronic structure according to claim 1, wherein said metal nitride-carbide material is substantially oxygen-free.

4. A microelectronic structure according to claim 1, wherein said metal nitride-carbide material contains C and N in sufficient amounts so that the sum of C and N is greater than 5 atomic % of the barrier layer material.

5. A microelectronic structure according to claim 1, wherein said metal nitride-carbide material contains C and N in sufficient amounts so that the sum of C and N is greater than 35 atomic % of the barrier layer material.

6. A microelectronic structure according to claim 1, wherein said metal nitride-carbide material contains C and N in sufficient amounts so that the sum of C and N is greater than 50 atomic % of the barrier material.

7. A microelectronic structure according to claim 1, wherein said metal nitride-carbide material contains less than 5 atomic % O.

8. A microelectronic structure according to claim 1, wherein said metal nitride-carbide material contains less than 3 atomic % O.

9. A microelectronic structure according to claim 1, wherein said metal nitride-carbide material contains less than 1 atomic % O.

10. A microelectronic structure according to claim 1, wherein said metal nitride-carbide material includes at least one metal selected from the group consisting of V, Cr and Nb.

11. A microelectronic structure according to claim 1, wherein said metal nitride-carbide material has a resistivity that is less than 240 $\mu\Omega \cdot cm$.

12. A microelectronic structure according to claim 1, comprising a memory cell integrated circuit structure.

13. A microelectronic structure according to claim 12, wherein the memory cell integrated circuit structure comprises a capacitor overlying a plug layer, the capacitor including top electrode, capacitive material layer and bottom electrode layer, wherein the adjacent material layers susceptible of adverse interaction in contact with one another comprise the plug layer and the bottom electrode layer of the capacitor.

14. A microelectronic structure according to claim 13, wherein the memory cell integrated circuit structure comprises a non-volatile memory cell integrated circuit structure, and the capacitive material layer is formed of a ferroelectric material.

15. A microelectronic structure according to claim 13, wherein the memory cell integrated circuit structure comprises a dynamic random access memory cell integrated circuit structure, and the capacitive material layer is formed of a high permittivity material.

16. A microelectronic structure according to claim 1, comprising a capacitor structure selected from the group consisting of stack capacitors and trench capacitors.

17. A microelectronic structure according to claim 1, wherein the adjacent material layers susceptible of adverse interaction in contact with one another, comprise a copper metallization layer, and a silicon-containing layer selected from the group consisting of Si and $SiO_2$.

18. A microelectronic structure according to claim 1, wherein the adjacent material layers susceptible of adverse interaction in contact with one another, comprise an organic insulating layer containing fluorine therein.

19. A microelectronic structure according to claim 1, wherein said barrier layer comprises a binary, ternary or higher order metal nitride-carbide material that includes silicon.

20. A microelectronic structure according to claim 1, wherein said barrier layer comprises a binary, ternary or higher order metal nitride-carbide material that includes aluminum.

21. A microelectronic structure according to claim 1, wherein said barrier layer comprises a binary, ternary or higher order metal nitride-carbide material that includes a metal selected from the group consisting of Hf, Ta and W.

22. A microelectronic structure according to claim 1, comprising a trench capacitor structure including a capacitor electrode formed of a metal selected from the group consisting of platinum and iridium, wherein said barrier layer comprises a binary, ternary or higher order metal nitride-carbide material that includes a metal selected from the group consisting of Hf, Ta and W.

23. A microelectronic structure according to claim 1, wherein said barrier layer comprises a binary, ternary or higher order metal nitride-carbide material that includes a mixture of TaN and TaC, in sufficient proportions relative to each other to produce a microstructure that is amorphous or nanocrystalline.

24. A microelectronic structure according to claim 1, wherein the adjacent material layers susceptible of adverse interaction in contact with one another, comprise an insulating layer containing copper.

25. A microelectronic structure according to claim 23, wherein the metal nitride-carbide material has a resistivity of less than 240 $\mu\Omega \cdot cm$.

26. A microelectronic structure according to claim 1, comprising a ULSI microelectronic structure including copper metallization.

27. A microelectronic structure according to claim 1, wherein said barrier layer comprises a binary, ternary or higher order metal nitride-carbide material that includes a nitride compound selected from the group consisting of TiN and TiAlN, and a carbide compound selected from the group consisting of HfC and TaC, in sufficient proportions relative to one another to constitute the barrier layer as an amorphous material layer.

28. A microelectronic structure according to claim 1, wherein the metal nitride-carbide material has the formula $Ti_m Ta_n Al_{1-m-n} N_x C_y$, wherein each of x, y, m and n $\leq 1$, subject to the provisos that m+n$\leq$1, and x+y=1.

29. A microelectronic structure according to claim 1, wherein the metal nitride-carbide material is substantially oxide-free, and the sum of C and N in the metal nitride-carbide material is greater than 5 atomic % of the barrier layer material.

30. A microelectronic structure according to claim 1, wherein the metal nitride-carbide material includes tantalum carbide.

31. A microelectronic structure according to claim 1, wherein said barrier layer comprises a binary, ternary or higher order metal nitride-carbide material that includes a metal carbide in a sufficient amount so that the barrier layer has an amorphous or nanocrystalline microstructure.

32. A method of making a microelectronic structure including adjacent material layers susceptible of adverse interaction in contact with one another, including a first underlying layer and a second overlying layer, comprising forming a barrier layer on the first underlying layer, and forming said second overlying layer on the barrier layer, wherein said barrier layer comprises a binary, ternary or higher order metal nitride-carbide material, whose metal constituents are different from one another and include at least one metal selected from the group consisting of transition metals Ti, V, Cr, Zr, Nb, Mo, Hf, Ta, W, Sc and Y.

33. A method according to claim 32, wherein the barrier layer is formed from a sputtering target with a corresponding metal composition.

34. A method according to claim 33, wherein the relative fractions of N and C in the barrier layer are controlled by sputtering conditions.

35. A method according to claim 32, wherein the barrier layer is formed by a process selected from the group consisting of:
reactive sputtering using a reactive source of nitrogen and carbon;
chemical vapor deposition;
nitridation of a deposited metallic layer;
carbidation of a deposited metallic layer; and
ion implantation of a deposited metallic layer.

36. A method according to claim 35, wherein the barrier layer is formed by reactive sputtering using $N_2$ as a nitrogen source and $CH_4$ as a carbon source.

37. A method according to claim 32, wherein said metal nitride-carbide material further comprises at least one element selected from the group consisting of silicon and aluminum.

38. A method according to claim 32, wherein the microelectronic structure comprises a memory cell integrated circuit structure.

39. A method according to claim 38, wherein the memory cell integrated circuit structure comprises a capacitor overlying a plug layer, the capacitor including top electrode, capacitive material layer and bottom electrode layer, wherein the adjacent material layers susceptible of adverse interaction in contact with one another comprise the plug layer and the bottom electrode layer of the capacitor.

40. A method according to claim 39, wherein the memory cell integrated circuit structure comprises a non-volatile memory cell integrated circuit structure, and the capacitive material layer is formed of a ferroelectric material.

41. A method according to claim 39, wherein the memory cell integrated circuit structure comprises a dynamic random access memory cell integrated circuit structure, and the capacitive material layer is formed of a high permittivity material.

42. A method according to claim 32, wherein the microelectronic structure comprises a capacitor structure selected from the group consisting of stack capacitors and trench capacitors.

43. A method according to claim 32, wherein the adjacent material layers susceptible of adverse interaction in contact with one another, comprise a copper metallization layer, and a silicon-containing layer selected from the group consisting of Si and $SiO_2$.

44. A method according to claim 32, wherein said barrier layer comprises a binary, ternary or higher order metal nitride-carbide material that includes silicon.

45. A method according to claim 32, wherein said barrier layer comprises a binary, ternary or higher order metal nitride-carbide material that includes aluminum.

46. A method according to claim 32, wherein said barrier layer comprises a binary, ternary or higher order metal nitride-carbide material that includes a metal selected from the group consisting of Hf, Ta and W.

47. A method according to claim 32, wherein the microelectronic structure comprises a trench capacitor structure including a capacitor electrode formed of a metal selected from the group consisting of platinum and iridium, wherein said barrier layer comprises a binary, ternary or higher order metal nitride-carbide material that includes a metal selected from the group consisting of Hf, Ta and W.

48. A method according to claim 32, wherein said barrier layer comprises a binary, ternary or higher order metal nitride-carbide material that includes a mixture of TaN and TaC, in sufficient proportions relative to each other to produce a microstructure that is amorphous or nanocrystalline.

49. A method according to claim 48, comprising a ULSI microelectronic structure including copper metallization.

50. A method according to claim 32, wherein said barrier layer comprises a binary, ternary or higher order metal nitride-carbide material that includes a nitride compound selected from the group consisting of TiN and TiAlN, and a carbide compound selected from the group consisting of HfC and TaC, in sufficient proportions relative to one another to constitute the barrier layer as an amorphous material layer.

51. A method according to claim 32, wherein the metal nitride-carbide material has the formula $Ti_mTa_nAl_{1-m-n}N_xC_y$, wherein each of x, y, m and $n \leq 1$, subject to the provisos that $m+n \leq 1$, and $x+y=1$.

52. A method according to claim 32, wherein the metal nitride-carbide material is substantially oxide-free.

53. A method according to claim 32, wherein the metal nitride-carbide material includes tantalum carbide.

54. A method according to claim 32, wherein said barrier layer comprises a binary, ternary or higher order metal nitride-carbide material that includes a metal carbide in a sufficient amount so that the barrier layer has an amorphous or nanocrystalline microstructure.

* * * * *